United States Patent [19]
Bruccoleri et al.

[11] Patent Number: 5,805,022
[45] Date of Patent: Sep. 8, 1998

[54] CIRCUIT FOR AUTOMATICALLY REGULATING THE GAIN OF A DIFFERENTIAL AMPLIFIER

[75] Inventors: Melchiorre Bruccoleri, Genoa; David Demicheli, Pavia; Marco Demicheli, Binago; Giuseppe Patti, Favara, all of Italy

[73] Assignee: SGS-Thomson Microelectronics, S.r.l., Agrate Brianza, Italy

[21] Appl. No.: 713,715

[22] Filed: Sep. 13, 1996

[30] Foreign Application Priority Data

Sep. 14, 1995 [EP] European Pat. Off. ............. 95830377

[51] Int. Cl.$^6$ ..................................................... H03G 3/30
[52] U.S. Cl. ........................... 330/254; 330/138; 330/280; 360/46
[58] Field of Search .................................. 330/129, 138, 330/254, 279, 280; 360/46, 67

[56] References Cited

U.S. PATENT DOCUMENTS 5,521,771 5/1996 Keithley et al. ......................... 360/75

FOREIGN PATENT DOCUMENTS

WO 93/19466 9/1993 WIPO ............................. G11B 20/10

Primary Examiner—James B. Mullins
Attorney, Agent, or Firm—David V. Carlson; Robert E. Mates; Seed and Berry LLP

[57] ABSTRACT

A circuit having a double half-wave rectifier connected to the outputs of a differential amplifier in order to produce two quantities dependent on the amplitudes of the half-waves of the output signal of the amplifier. Two comparators each having an input are connected to an output of the rectifier and a reference input in order to produce respective output signals when the amplitudes of the respective half-waves are greater than the levels applied to the reference inputs. The circuit also has processing means for generating a signal for regulating the gain of the amplifier in dependence on the durations of the output signals of the two comparators. The circuit may advantageously be used when the signal to be amplified is not symmetrical.

20 Claims, 4 Drawing Sheets

CIRCUIT FOR AUTOMATICALLY REGULATING THE GAIN OF A DIFFERENTIAL AMPLIFIER

TECHNICAL FIELD

The present invention relates to a circuit for automatically regulating the gain of a differential amplifier.

BACKGROUND OF THE INVENTION

In many applications it is necessary to amplify a signal of variable amplitude in a manner such that the level of the amplifier signal is substantially constant. For this purpose, amplifiers with gains which can be regulated according to the level of the output signal by means of a suitable feedback loop are used.

An example of a known circuit for automatically regulating the gain of a differential amplifier is shown schematically in FIG. 1. A differential amplifier, indicated VGA, with variable gain, receives a signal, for example, a sinusoidal signal, between its two inputs, indicated v+ and v−, and produces, between its outputs out+ and out−, a signal which is amplified in comparison with the input signal to an extent which depends upon a signal applied to a control terminal thereof, indicated CTR. The outputs of the amplifier are connected to a full-wave rectifier, indicated FWR, which produces, at its output OUTfwr, a signal which is composed of a succession of unidirectional half-waves corresponding to the half-waves of the output signal of the amplifier VGA, relative to a constant voltage present at a terminal indicated REFfwr. A comparator COMP has a non-inverting input IN+ connected to the output OUTfwr of the rectifier and an inverting input IN− connected to a reference generator Gref. The latter is formed by a current generator Ir and by a resistor Rr connected in series between a supply voltage terminal Vdd and the reference terminal REFfwr of the rectifier. The voltage applied to the input IN− of the comparator COMP is given by the sum of the reference voltage at the terminal REFfwr and the voltage drop Ir.Rr, where the current Ir and the resistance Rr are indicated by the same symbols as the corresponding components.

The output of the comparator COMP is connected to a circuit of the so-called charge-pump type constituted by a storage circuit Str, by a buffer amplifier A and by a cell RC formed by a capacitor C and by a resistor R. The storage circuit Str is constituted by a capacitor Ca and by two current generators I and a.I, where a is a fraction of 1, connected in series with one another between the pole Vdd of the supply and ground by means of an electronic switch SW. The electronic switch SW is controlled by the output of the comparator COMP. The capacitor C has one terminal connected to ground and the other connected to the resistor R and to a voltage/current convertor V/I, the output of which is connected to the control terminal CTR of the amplifier VGA.

The operation of the circuit will now be considered. If the output OUTfwr of the rectifier is less than the voltage applied to the inverting input of the comparator COMP, the switch SW is open. The capacitor Ca is charged by the current a-I so that the current supplied to the capacitor C of the cell RC through the buffer A increases and the capacitor C is charged, causing the current at the control terminal CTR, and hence the gain of the differential amplifier, to increase. If the output OUTfwr of the rectifier is equal to or greater than the voltage at the inverting input of the comparator COMP, the switch SW closes so that the capacitor Ca discharges with a current I-a-I and the voltage applied to the cell RC decreases causing the regulating current, and hence the gain of the amplifier VGA, to decrease. In steady state operation, the peak-peak amplitude of the output signal of the amplifier VGA stabilizes at a constant value determined by the voltage of the reference generator Gref.

The known circuit described above operates satisfactorily as long as the input signal of the amplifier VGA is symmetrical, that is, is constituted by positive and negative half-waves of the same amplitude. If, however, the input signal is asymmetrical the gain is determined exclusively by the half-wave of greater amplitude. This may constitute a problem if the signal contains binary data which have to be interpreted as logic levels 1 or 0 according to whether the amplitude is above or below a predetermined value. The problem is even more serious when the asymmetry is variable over time, since the peak-peak amplitude determined by the reference value of the generator Gref may become inadequate for correct reading of the data associated with the half-waves of lower amplitude. A situation of this type may occur when the input signal of the differential amplifier VGA comes from a magnetoresistive head for reading memories on magnetic media (for example "hard disks").

SUMMARY OF THE INVENTION

According to principles of the present invention, a circuit is provided for automatically regulating the gain of a differential amplifier which operates satisfactorily even when an asymmetrical signal is to be amplified.

More specifically, the principles of the present invention provide for a circuit for automatically regulating the gain of a differential amplifier having detection means for detecting the level of the output signal of the amplifier and comparison and processing means for supplying a regulating signal at a control terminal for regulating the gain of the amplifier if the level detected by the detector means deviates from a predetermined value. The detection means further includes a double half-wave rectifier connected to the outputs of the differential amplifier in order to produce, at first and second outputs, respectively, first and second quantities dependent on the amplitudes of the positive and negative half-waves of the output signal of the amplifier, respectively, relative to the predetermined reference level. The comparison means further includes first and second comparators, each having a signal input connected to the first or second output of the rectifier, respectively, and a reference input connected to means for generating reference levels in order to produce respective output signals when the first and second quantities are greater than the reference levels applied to the respective reference inputs. Lastly, the processing means are connected to the outputs of the first and second comparators for generating the aforementioned regulating signal in dependence on the durations of the output signals of the two comparators.

BRIEF DESCRIPTION OF THE DRAWINGS

The invention will be understood better from the following detailed description of an embodiment thereof given by way of example with reference to the appended drawings.

DETAILED DESCRIPTION OF THE INVENTION

Figure 1:
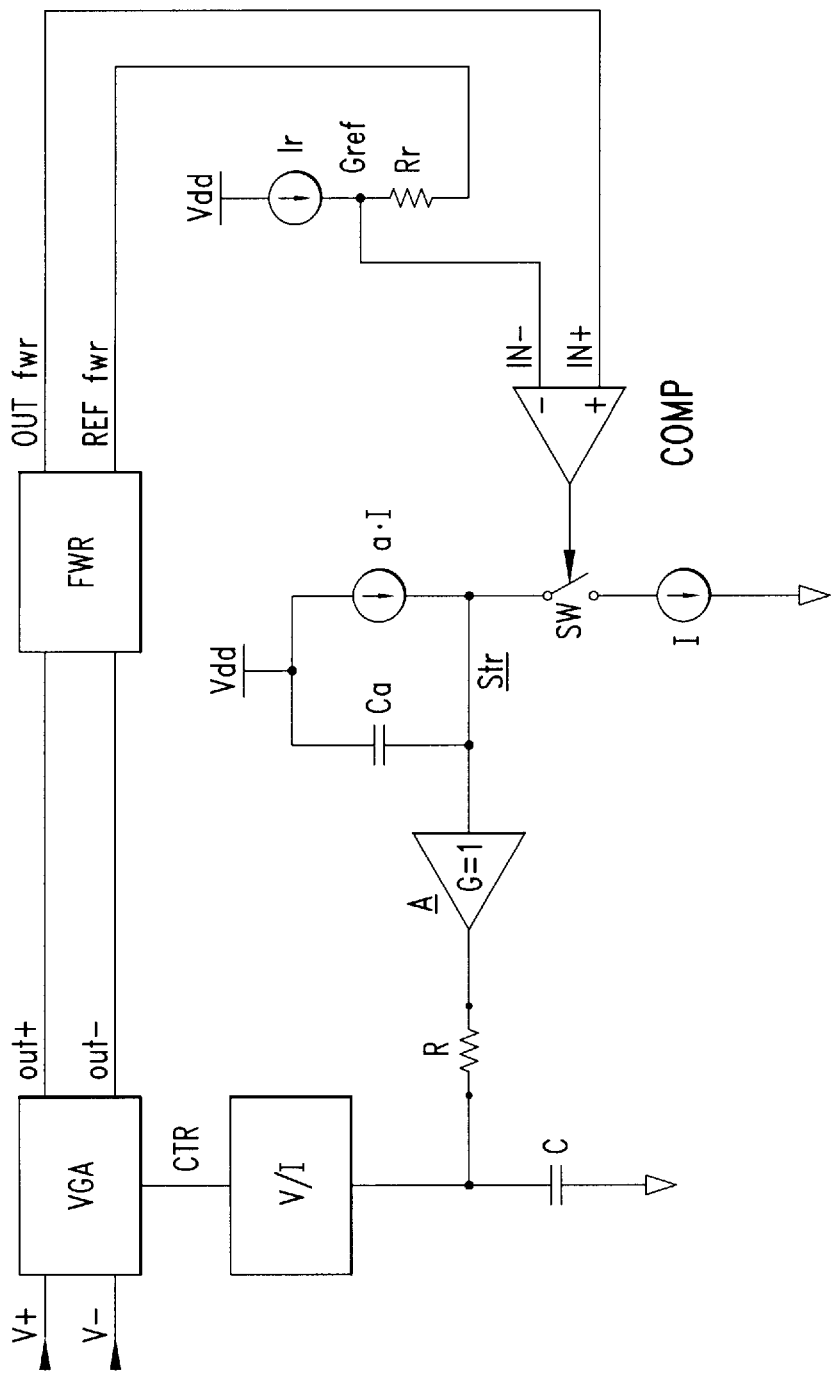
FIG. 1 is a diagram showing the concept of a known circuit for automatically regulating gain of a differential amplifier.
Figure 2:
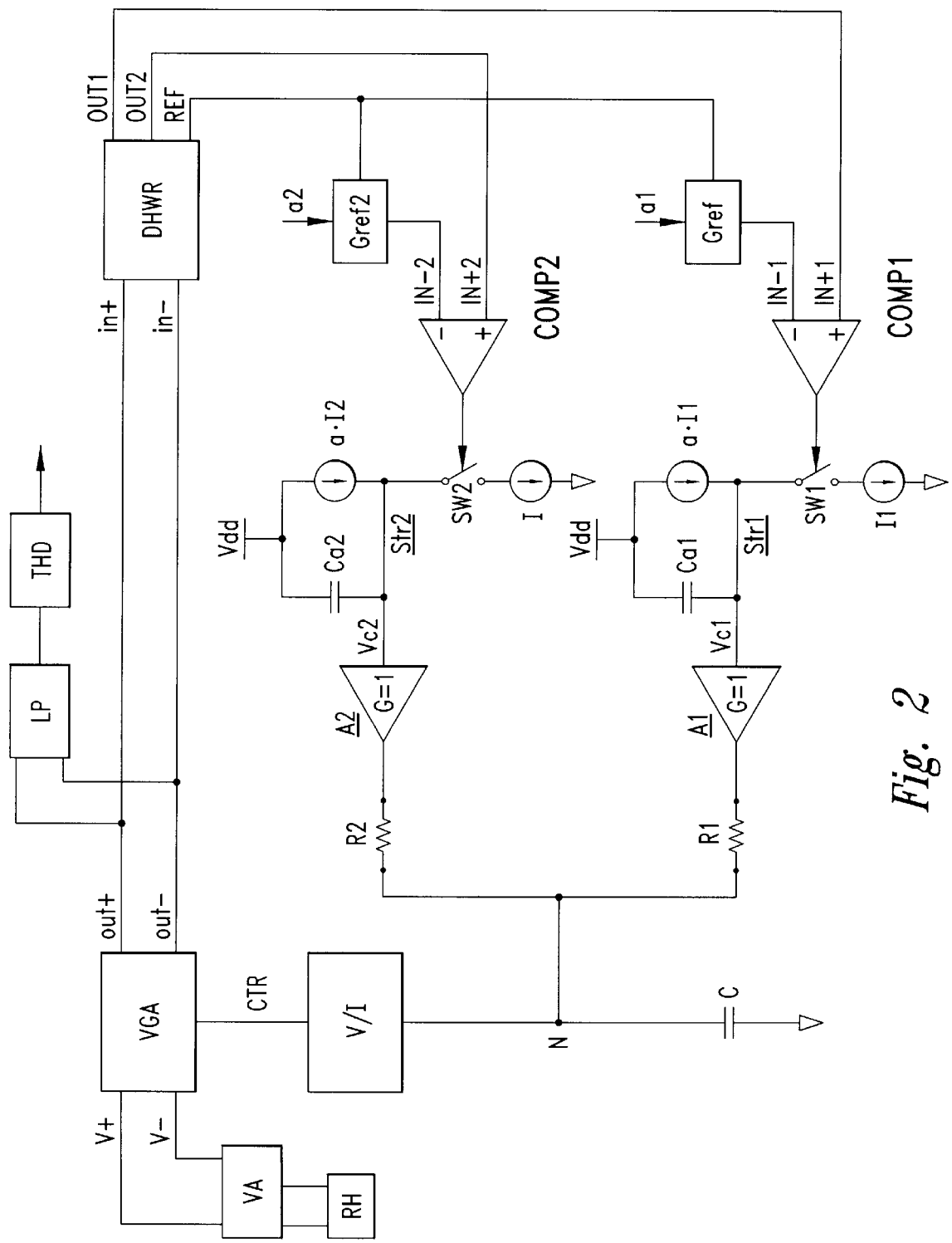
FIG. 2 is a diagram showing the concept of a device which incorporates an automatic gain-regulating circuit according to an embodiment of the invention.

FIG. 2, in which elements identical to those of the circuit of FIG. 1 are indicated by the same reference symbols, shows a circuit according to an embodiment of the invention used to produce a signal of constant amplitude from the output signal of a magnetoresistive reading head RH, of a magnetic-disc data-recording unit. The signal produced by the reading head RH is normally an asymmetrical alternating voltage and may have a peak-peak amplitude variable of, for example, between 10 and 20 $\mu$V. The signal is amplified in a voltage amplifier VA, for example, with a gain of 1000, and is then applied to the differential inputs of a differential amplifier VGA with variable gain. The output of the differential amplifier is regulated, as will be described below, and is applied, through a low-pass filter LP, to a threshold detector circuit THD. The threshold detector circuit THD extracts from the signal the digital data content corresponding to that recorded on the disc for use in a data-processing system, not shown.

In order to regulate the gain, the output of the differential amplifier VGA is connected to the inputs in+, in− of a double half-wave rectifier DHWR with the function of detecting the levels of the half-waves of the signal. This rectifier supplies the positive half-waves of the input voltage signal at one output OUT1 and the rectified negative half-waves of the same signal at another output OUT2, relative to a fixed reference voltage available at a terminal REF. This fixed voltage is selected so as to be equal to the voltage present at the output terminals OUT1 and OUT2 when the difference between the voltages present at the inputs in+ and in− is equal to zero.

Two comparators COMP1 and COMP2 have respective first inputs IN+1 and IN+2 connected to the respective rectifier outputs OUT1 and OUT2, and respective second inputs IN-1 and IN-2 connected to reference generators Gref1 and Gref2, respectively. Each of these two reference generators generates a reference voltage depending on a signal which is applied to a suitable terminal a1, a2, respectively, and which varies in dependence on the degree of asymmetry of the input signal of the amplifier VGA. The outputs of the comparators COMP1 and COMP2 are connected to signal-processing means which comprise two storage circuits each connected downstream to a buffer amplifier and to a resistor similar to those of the circuit of FIG. 1. It should be noted that the components similar to those of FIG. 1 are indicated by the same reference symbols with the addition of a "1" or a "2". The outputs of the buffer amplifiers A1 and A2 are connected, by means of respective resistors R1 and R2, to a circuit node N to which a terminal of a capacitor C is also connected, its other terminal being connected to ground. The resistors R1, R2 and the capacitor C together constitute a cell RC similar to the cell RC of the circuit of FIG. 1.

By way of indication, in a fully-integrated embodiment of the circuit, the capacitances of the two capacitors Ca may be about 10 pF and that of the capacitor C 10–20 pF.

The operation of the circuit of FIG. 2 will now be considered.

If both of the outputs OUT1 and OUT2 of the rectifier DHWR are below the reference voltages applied to the terminals IN-1 and IN-2 of the comparators COMP1 and COMP2, respectively, the switches SW1 and SW2 are open and the capacitors Ca1 and Ca2 are charged by the currents a.I1 and a.I2 (where a is again a fraction of 1). The capacitor C is supplied with a current which is given by the sum of the currents output by the amplifiers A1 and A2 so that it is charged causing the current at the regulation terminal CTR, and hence the gain of the differential amplifier VGA, to increase.

If one output OUT1 or OUT2 of the rectifier DHWR is equal to or greater than the reference voltage at the inverting input of the respective comparator COMP1 or COMP2, the respective switch SW1 or SW2 closes so that the respective capacitor Ca1 or Ca2 discharges until a current I1-a.I1 or I2-a.I2, thus interrupting its contribution to the charging of the capacitor C.

In steady state operation, the charge in the capacitor C, and hence the regulating current at the terminal CRT, is a function of the voltages Vc1 and Vc2 present at the outputs of the storage circuits Str1 and Str2. Since these voltages depend on the charges of the capacitors Ca1 and Ca2 which in turn depend on the states of the switches Sw1 and Sw2, the signal for regulating the amplifier VGA depends on the durations of the output signals of the two comparators COMP1 and COMP2.

Clearly, in summary, the gain of the amplifier VGA is regulated with account being taken of the independent contributions of the positive and negative half-waves so that the peak-peak amplitude of the output signal of the amplifier VGA stabilizes, in steady state operation, at a constant value which depends upon the reference voltages supplied to the comparators by the reference generators Gref1 and Gref2. As stated above, these are regulated in dependence on the asymmetry of the input signal of the amplifier VGA by means of a suitable regulation of the reference generators by means of signals applied to the terminals a1 and a2.

Figure 3:
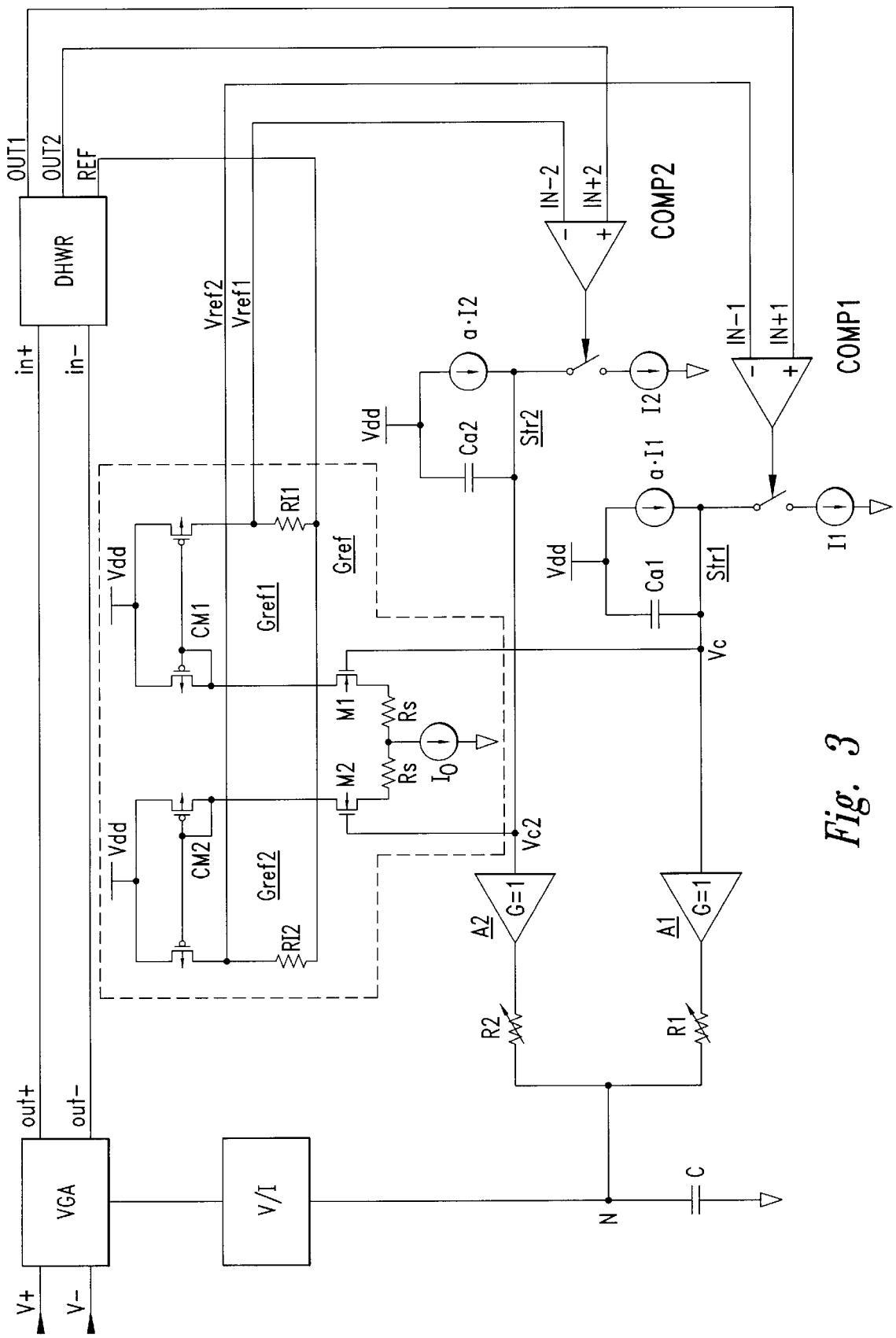
FIG. 3 is a partial block diagram and a partial circuit diagram of the regulating circuit according to another embodiment of the invention.

A circuit according to another embodiment of the invention for automatically regulating the reference voltages applied to the comparators is shown in FIG. 3, in which elements identical to those of FIG. 2 are indicated by the same reference symbols. This circuit, which is enclosed by a broken line and generally indicated Gref, performs the function of a reference-voltage generator which was performed by the blocks Gref1 and Gref2 in FIG. 2. As can be seen, Gref is a differential amplifier having two N-channel MOS transistors M1 and M2. Transistors M1 and M2 have their source terminals connected, each through a resistor Rs, to a generator of a constant current Io, connected to ground. The drain terminals of transistors M1 and M2 are connected to the positive pole Vdd of the supply by means of respective current mirrors CM1 and CM2. The output branches of the current mirrors are connected to the terminal REF of the rectifier DHWR by means of load resistors Rl1, Rl2. The gate terminals of the transistors M1 and M2 constitute two inputs of the amplifier Gref and are connected to the outputs Vc1 and Vc2 of the storage circuits Str1 and Str2. The points at which the resistors Rl1 and Rl2 are connected to the circuit branches of the current mirrors constitute the outputs of the amplifier Gref and are connected to the inputs IN-2 and IN-1 of the two comparators COMP2 and COMP1, respectively.

The voltages Vref2 and Vref1 applied to inputs IN-1 and IN-2 are formed by the sum of the reference voltage at the terminal REF and of the drops in the resistors Rl1 and Rl2. The voltages Vref1 and Vref2 will tend to vary in a manner such that, in steady state operation, the average of the amplitudes of the peaks of the half-waves at the terminals OUT1 and OUT2 is equal to (Io/2).R1 where Io is the current of the generator indicated by the same symbol and R1 is the resistance of the resistors RI1 and RI2. The gain of the differential amplifier VGA is thus determined completely automatically on the basis of the amplitudes of both of the half-waves of the output signal of the amplifier. More particularly, in steady state operation, the output voltages of the storage circuits Str1 and Str2 have saw-toothed waveforms the leading edges of which have gradients of a.I1/C1 and a.I2/C2, respectively, and the trailing edges of which have gradients of (I1-a.I1)/C1 and (I2-a.I2)/C2, respectively. If the signal is not symmetrical, the leading and trailing edges of the two waveforms have different durations. The resistors R1 and R2 provide, at the node N, a voltage which, in steady state operation, is the average value of the voltages produced by the storage circuits Str1 and Str2 smoothed by the capacitor C which acts as a low-pass filter. The voltage present at the node N is converted into a current by the converter V/I and is applied to the differential amplifier VGA through its control terminal CTR.

The resistors R1 and R2 may be of adjustable type for precise calibration of the circuit.

Figure 4:
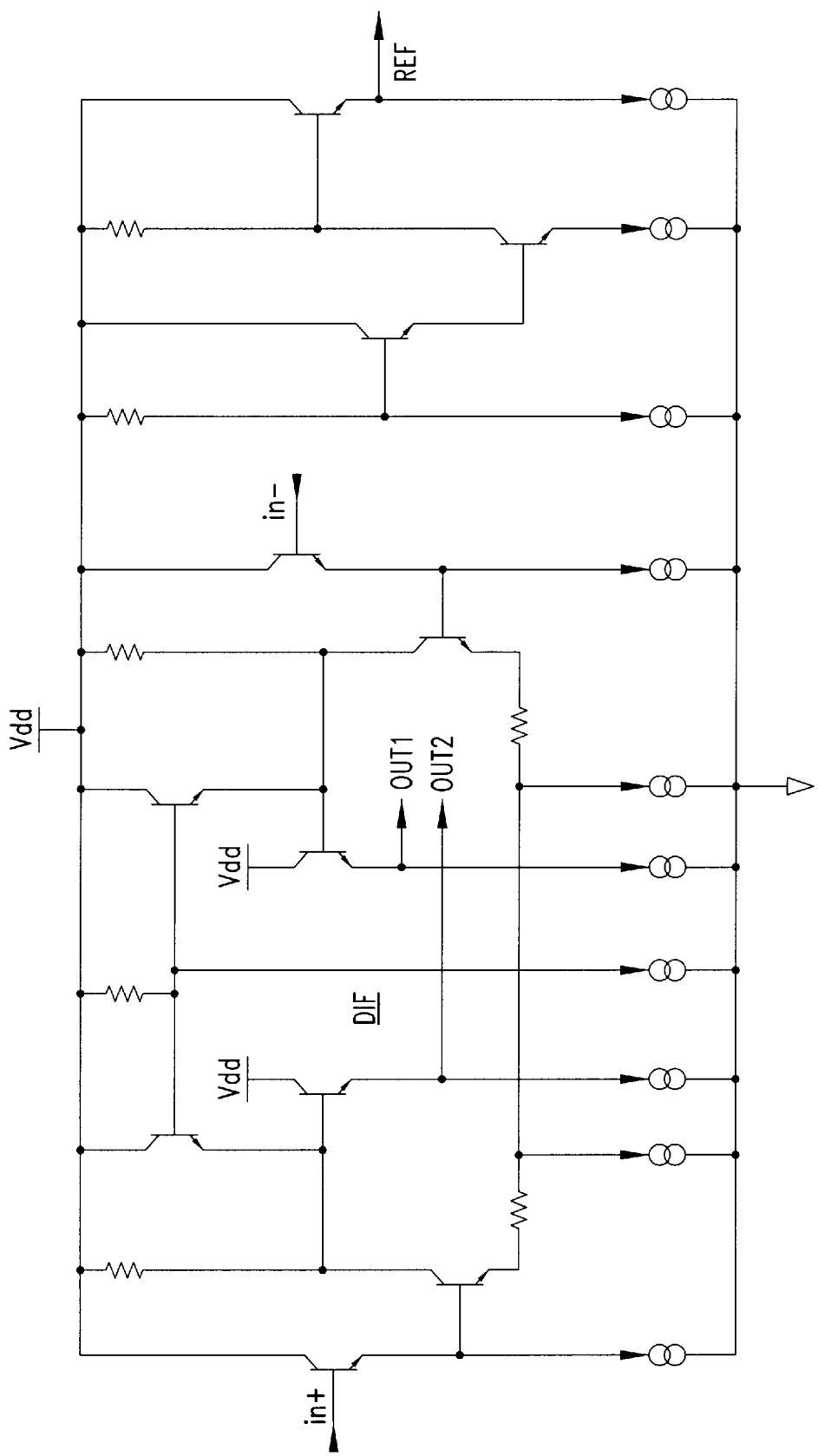
FIG. 4 is a simplified circuit diagram of a double half-wave rectifier usable in the circuit of FIG. 3.

The circuit diagram of a known double half-wave rectifier DHWR as shown in FIG. 3 is illustrated in FIG. 4 according to another embodiment of the invention. As can be seen, it is constituted by a differential amplifier DIF and by a circuit portion for producing, at the terminal REF, a reference voltage, the value of which is equal to the voltage at each of the outputs OUT1 and OUT2 when the difference between the voltages at the inputs in+ and in− is zero.

Although a single embodiment of the invention has been described and illustrated, clearly many variations and modifications are possible within the scope of the same inventive concept. For example, digital circuits (adding/subtracting counters, registers) could be used as means for processing the signal output by the comparators instead of the analog circuits described.

We claim:

1. A circuit for automatically regulating a gain of a differential amplifier, comprising:
    a detection circuit for detecting a level of an output signal of the differential amplifier, the output signal having positive and negative half-waves;
    a comparison circuit and a process circuit for supplying a regulating signal at a control terminal of the differential amplifier for regulating the gain of the differential amplifier if the level of the output signal detected by the detection circuit deviates from a predetermined value, wherein the detection circuit includes a double half-wave rectifier connected to a plurality of outputs of the differential amplifier in order to produce, at first and second outputs, respectively, first and second signals dependent on amplitudes of the positive and negative half-waves of the output signal of the differential amplifier, respectively, relative to a predetermined reference level;
    wherein the comparison circuit includes first and second comparators each having a signal input connected to the first or the second output of the double half-wave rectifier, respectively, and a reference input connected to a generation circuit for generating two reference levels, the reference levels being applied to the respective reference inputs of the first and second comparators, the first and second comparators being structured to produce respective output signals at respective outputs when the first and second signals are greater than the reference levels applied to the respective reference inputs; and
    wherein the process circuit is connected to the outputs of the first and second comparators for generating the regulating signal in dependence on a duration of each of the output signals of the first and second comparators.

2. The circuit of claim 1 wherein the process circuit further comprises:
    first and second charge-storage circuits connected to the outputs of the first and second comparators, respectively, the first and second charge-storage circuits being structured to produce respective voltages depending on the durations of the output signals of the first and second comparators;
    an averaging circuit structured to determine an average value of the voltages produced by the charge-storage circuits; and
    a low-pass filter connected between the averaging circuit and the control terminal of the differential amplifier.

3. The circuit of claim 2 wherein the averaging circuit comprises two resistors, each resistor being connected between an output of a respective charge-storage circuit and a common circuit node, and the low-pass filter comprises a capacitor connected to the common circuit node.

4. The circuit of claim 3, further comprising a buffer amplifier coupled between each charge-storage circuit and the respective resistor.

5. The circuit of claim 2 wherein the generation circuit for generating two reference levels is connected to respective outputs of the first and second charge-storage circuits, respectively, and is structured to produce the two reference levels dependent on the voltages present at the outputs of the first and second charge-storage circuits.

6. The circuit of claim 5 wherein the generation circuit for generating two reference levels comprises a differential circuit having one input connected to the first charge-storage circuit and another input connected to the second charge-storage circuit, the generation circuit having a pair of outputs, each output being connected to one of the reference inputs of one of the first and second comparators.

7. A circuit for regulating a gain of a differential amplifier comprising:
    a double half-wave rectifier having first and second inputs and first, second and third rectifier outputs, said first and second inputs being coupled to respective outputs of said differential amplifier and said third rectifier output being coupled to a reference potential;
    a differential circuit having first and second difference outputs and a difference input, said difference input being coupled to said reference potential;
    a comparison circuit having first and second switch outputs, said comparison circuit being coupled to said first and second rectifier outputs and said first and second difference outputs; and
    a process circuit having a control output and being coupled between said first and second switch outputs and said differential amplifier, said process circuit being structured to generate at said control output a circuit regulating signal dependent on a duration of an output signal of said comparison circuit.

8. The circuit of claim 7 wherein said first and second inputs of said double half-wave rectifier are structured to receive, respectively, positive and negative half-wave signals having respective amplitudes from the outputs of said differential amplifier.

9. The circuit of claim 8 wherein said double half-wave rectifier is structured to generate, at said first and second rectifier outputs, first and second signals dependent on said respective amplitudes of said positive and negative half-wave signals, said first and second signals being generated relative to said reference potential.

10. The circuit of claim 9 wherein said comparison circuit comprises first and second comparators, said first comparator being coupled between said first switch output, said first rectifier output, and said first difference output, respectively, and said second comparator being coupled between said second switch output, said second rectifier output, and said second difference output, respectively.

11. The circuit of claim 10 wherein said differential circuit is structured to generate first and second reference level signals at said first and second difference outputs, respectively.

12. The circuit of claim 11 wherein said differential circuit further includes signal inputs from first and second reference nodes in said process circuit.

13. The circuit of claim 12 wherein said process circuit further comprises:

first and second charge-storage circuits coupled to said first and second switch outputs, respectively, and structured to generate respective voltages;

a resistive element coupled between said first and second charge-storage circuits and an intermediate node and operative to provide an average value of the respective voltages generated by said charge-storage circuits, and a low-pass filter coupled between said resistive element and a control terminal of said differential amplifier.

14. The circuit of claim 13 wherein said resistive element comprises a first variable resistor and a second variable resistor, each variable resistor being coupled between one of said respective charge-storage circuits and said intermediate node.

15. The circuit of claim 13, further comprising first and second buffer amplifiers coupled, respectively, between said first and second charge-storage circuits and said resistive element.

16. A method for regulating a gain of a differential amplifier comprising the steps of:

sensing a level of a pair of differential output signals of said differential amplifier to generate first and second sensed signals;

generating first and second reference voltages;

comparing the first and second sensed signals, respectively, to the first and second reference voltages;

generating first and second comparison signals based on the comparison;

providing a control signal to a control input of said differential amplifier based on the first and second comparison signals.

17. The method of claim 16 wherein said step of sensing a level of a pair of differential output signals comprises rectifying the differential output signals in a double half-wave rectifier to generate first and second rectified signals, the differential output signals being phase shifted by approximately 180 degrees with respect to each other.

18. The method of claim 16 wherein said step of generating first and second reference voltages comprises generating first and second reference voltages in a second differential amplifier circuit based on the first and second comparison signals and a third reference voltage.

19. The method of claim 16 wherein the step of generating first and second reference voltages comprises generating first and second reference voltages that vary in dependence on a degree of asymmetry of an input signal of said differential amplifier.

20. The method of claim 16 wherein said step of providing a control signal further comprises the step of stabilizing the pair of differential output signals of said differential amplifier by regulating the gain of said differential amplifier based on the control signal.

* * * * *

UNITED STATES PATENT AND TRADEMARK OFFICE
CERTIFICATE OF CORRECTION

PATENT NO.      :   5,805,022
DATED           :   September 8, 1998
INVENTOR(S)     :   Melchiorre Bruccoleri et al.

It is certified that errors appear in the above identified patent and that said Letters Patent is hereby corrected as shown below:

On the cover page, item [75] after "Bruccoleri," please delete "Genoa; David" and insert therefor "Genova; Davide"

Signed and Sealed this

Fourteenth Day of November, 2000

*Attest:*

Q. TODD DICKINSON

*Attesting Officer*       *Director of Patents and Trademarks*

UNITED STATES PATENT AND TRADEMARK OFFICE
CERTIFICATE OF CORRECTION

PATENT NO. : 5,805,022
DATED : September 8, 1998
INVENTOR(S) : Melchiorre Bruccoleri et al.

It is certified that error appears in the above-identified patent and that said Letters Patent is hereby corrected as shown below:

On the cover page, item [73] please insert as an additional assignee "CO.RI.M.ME. Consorzio Per La Ricerca Sulla Microelettronica Nel Mezzogiorno, Catania, Italy Signed and Sealed this Sixth Day of March, 2001

Attest:

NICHOLAS P. GODICI

Attesting Officer

Acting Director of the United States Patent and Trademark Office